(12) United States Patent
Yasuda et al.

(10) Patent No.: US 6,208,032 B1
(45) Date of Patent: Mar. 27, 2001

(54) SEMICONDUCTOR DEVICE AND FABRICATION METHOD THEREOF

(75) Inventors: Hidefumi Yasuda; Mayumi Tomita, both of Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/337,672

(22) Filed: Jun. 22, 1999

(30) Foreign Application Priority Data

Jun. 23, 1998 (JP) .................................................. 10-176456

(51) Int. Cl.[7] ..................................................... H01L 23/48
(52) U.S. Cl. ......................... 257/758; 257/753; 257/763; 257/759
(58) Field of Search ................................ 257/758, 753, 257/763, 759

(56) References Cited

U.S. PATENT DOCUMENTS

| | | | |
|---|---|---|---|
| 4,417,387 | * 11/1983 | Heslop | 29/591 |
| 4,970,574 | * 11/1990 | Tsunenari | 357/71 |
| 5,155,576 | 10/1992 | Mizushima . | |
| 5,262,353 | * 11/1993 | Sun et al. | 437/195 |
| 5,336,929 | * 8/1994 | Hayashi | 257/772 |
| 5,380,679 | * 1/1995 | Kano | 437/192 |
| 5,416,359 | * 5/1995 | Oda | 257/751 |
| 5,834,845 | * 11/1998 | Stolmeijer | 257/752 |
| 6,020,640 | * 2/2000 | Efland et al. | 257/751 |

* cited by examiner

Primary Examiner—Eddie C. Lee
Assistant Examiner—Eugene Lee
(74) Attorney, Agent, or Firm—Finnegan, Henderson, Farabow, Garrett & Dunner, L.L.P.

(57) ABSTRACT

A semiconductor device having an inter-layer insulation film that allows a refractory metal to be easily etched and that well covers high side walls of a gold plate and a fabrication method thereof are disclosed. The semiconductor device comprises a semiconductor substrate, a conductive portion formed on the semiconductor substrate, a metal film formed on the conductive portion, a gold plate portion formed on the metal film, an inter-layer insulation film formed on an area of the semiconductor substrate, the area being free from the conductive portion, the metal film, and the gold plate portion in such a manner that the inter-layer insulation film contacts side walls of the conductive portion, the metal film, and the gold plate portion, a refractory metal film formed in such a manner that the refractory metal film coats the gold plate portion, and a protection film formed in such a manner that the protection film exposes part of the refractory metal film as an electrically connecting portion and coats the inter-layer insulation film and the refractory metal film.

4 Claims, 6 Drawing Sheets

R : ALKYL GROUP

POLYMER

SEMICONDUCTOR DEVICE AND FABRICATION METHOD THEREOF

BACKGROUND OF THE INVENTION

1. Field of the Invention

The present invention relates to a semiconductor device and a fabrication method thereof, in particular, to a compound semiconductor device using gold plating and a fabrication method thereof.

2. Description of the Related Art

As the density and integration of semiconductor devices have become high, a multi-layer wiring structure has been widely used. With such a structure, in addition to the accomplishment of high integration, a wiring pattern can be easily designed. However, as drawbacks of the multi-layer wiring structure, the number of fabrication steps increases. In addition, the front surface of a multi-layer wiring structure unsmooths. When the surface of the multi-layer wiring structure unsmooths, a wire breakage and a migration will take place. Thus, the smoothness of the front surface of the multi-layer wiring structure is very important.

The multi-layer wiring structure is obtained as follows: contact holes are formed in a substrate. Metal is clad and patterned. An insulation layer is disposed on the patterned metal. After a predetermined number of layers are formed, bonding pads are formed.

Film materials used for the multi-layer wiring structure are metal films and insulation films. Preferred characteristics of the metal films include a good step coverage, a low resistance, a high ohmic contact to the substrate, a good adhesion to the base material of the insulation film, an easy patterning characteristic, uniform and homogeneous, a high migration resistance, and chemical and thermal stabilities. Preferred characteristics of the insulation films include a good step coverage, an excellent insulation, a good adhesion to metal, a low reactiveness to metal, an excellent passivation against contamination.

Examples of such metal films include Al, Ti, Pt, Mo, W, and alloys thereof. Examples of such insulation films include $SiO_2$, PSG, $SiO_2$—PSG, $SiO_2$-plasma $Si_3N_4$, $Al_2O_3$, and polyimide.

In the multi-layer wiring structure, gold may be plated for a metal so as to decrease the wiring resistance and increase the resultant height. However, the gold plate does not have good adhesion to a CVD passivation film formed thereon. To solve this problem, it is necessary to improve the adhesion to the passivation film by, for example, forming a Ti layer between the gold plate and the passivation film.

Next, with reference to FIGS. 3A to 3H, a fabrication method of a conventional semiconductor device having a multi-layer wiring structure will be described.

A metal film 2 is formed on a GaAs semiconductor substrate 1 (see FIG. 3A). The metal film 2 is composed of an Au layer, a Pt layer, and a Ti layer that successively disposed as an upper layer, a middle layer, and a lower layer, respectively. The thicknesses of the Au layer, the Pt layer, and the Ti layer are 10,000 Å, 300 Å, and 500 Å, respectively. An under-resist 3 is formed on the metal film 2 by photo-etching process (see FIG. 3B). The under-resist 3 is hard-baked (see FIG. 3C). A plating base metal film 4 is formed on the hard-baked under-resist 3. The plating base metal film 4 is composed of an Au layer and a Ti layer that are successively disposed as an upper layer and a lower layer, respectively (see FIG. 3D). The thicknesses of the Au layer and the Ti layer are 1,000 Å and 50 Å, respectively. A top-resist 5 is formed by photo-etching process (see FIG. 3E). A gold plate 6 is electrolytically precipitated to an area free of the top-resist 5 for a thickness of 4 μm (see FIG. 3F). The top resist 5 and the under-resist 3 are successively peeled off (see FIG. 3G). A Ti film 8 is evaporated or vapor deposited on the entire front surface of the substrate. The Ti film 8 is photo-etched with a mask. A resist 9 is peeled off (see FIG. 3H). In the above-described steps, the Ti film 8 remains on the plating base metal film 4 in a whisker shape. In addition, it is difficult to form a CVD passivation film or the like on the Ti film 8 in such a manner that the CVD passivation film well covers bulky side walls of the gold plate.

As described above, in the semiconductor device having the multi-layer wiring structure, when gold is plated, a refractory metal such as Ti is evaporated so as to improve the adhesion of gold to the CVD passivation film. However, in this case, it is difficult to well cover the bulky side walls of the gold plate with the CVD passivation film.

SUMMARY OF THE INVENTION

This application claims priority on Japanese Patent Application No. Hei 10-176456 filed on Jun. 23, 1998, the contents of which are incorporated herein by reference.

An object of the present invention is to provide a semiconductor device having an inter-layer insulation film that allows a refractory metal to be easily etched and that well covers bulky side walls of a gold plate. Another object of the present invention is to provide a fabrication method of such a semiconductor device.

A first aspect of the present invention is a semiconductor device, at least comprising a semiconductor substrate, a conductive portion formed on the semiconductor substrate, a metal film formed on the conductive portion, a gold plate portion formed on the metal film, an inter-layer insulation film formed on an area of the semiconductor substrate, the area being free from the conductive portion, the metal film and the gold plate portion in such a manner that the inter-layer insulation film contacts side walls of the conductive portion, the metal film and the gold plate portion, a refractory metal film formed in such a manner that the refractory metal film coats the gold plate portion, and a protection film formed in such a manner that the protection film exposes part of the refractory metal film as an electrically connecting portion and coats the inter-layer insulation film and the refractory metal film.

A second aspect of the present invention is a fabrication method for a semiconductor device, at least comprising the steps of depositing a conductive film on a semiconductor substrate and patterning the conductive film to form a conductive portion, depositing a metal thin film on the conductive portion, forming a gold plate portion on the metal thin film, coating the semiconductor substrate, the conductive portion, the metal thin film, and the gold plate portion with an inter-layer insulation film, patterning the inter-layer insulation film in such a manner that only an upper portion of the gold plate portion is exposed, depositing a refractory metal film on the exposed gold plate portion, depositing a protection film on the inter-layer insulation film and the refractory metal film, and forming an opening in the protection film and exposing part of the refractory metal film as an electrically connecting portion.

In the semiconductor device and fabrication method thereof according to the present invention, since the inter-layer insulation film is disposed on the bulky side walls of the gold plate portion, improved coverage of the protection film formed thereon is achieved. In addition, after the inter-layer insulation film is deposited, the upper portion of the gold plate is exposed and the refractory metal is evaporated thereto. Thus, the refractory metal can be easily and accurately etched.

In the semiconductor device and fabrication method thereof according to the present invention, the material of the inter-layer insulation film is not limited as long as it can smoothly adhere to a thick film. Examples of the material of the inter-layer insulation film include organic resin films such as benzocyclobutene and polyimide.

The inter-layer insulation film is coated as a thick film with a thickness almost twice larger than the film thickness of the gold plate. Consequently, side walls of the gold plate are covered with the inter-layer insulation film, thereby forming the Ti film uniformly on the gold plate. Thus, the problem of the step coverage can be solved.

Benzocyclobutene has a structure shown in FIG. 2 where R repesents an alkyl group. Benzocyclobutene polymerizes by ring-opening polymerizationand hardens. After polymerization, the thermal decomposition temperature of benzocyclobutene is 400° C. The glass transition temperature of the same is as high as 350° C. Thus, the hardened benzocyclobutene has excellent thermal resistance. In addition, benzocyclobutene has a good coverage characteristic (surface smoothness) so that the film thickness thereof can be varied from 1 to 25 $\mu$m.

Since polyimide resin is dehydrated and polycondensated, the film thickness decreases and thereby the surface smoothness is not good. In addition, the moisture resistance of polyimide resin is inferior to that of benzocyclobutene. However, according to the present invention, since polyimide resin is not exposed in a wiring portion, polyimide resin can be effectively used.

When carbon adheres to the front surface of the benzocyclobutene layer, since the adhesion between the benzocyclobutene layer and a metal wiring pattern (i.e., Cu, Ti, Al, or Cr) remarkably deteriorates, it is preferred to use etching gas that does not give off carbon. Thus, when a mixed gas of $SF_6$ and $O_2$ is used, the mixed gas dissociates and thereby prevents carbon from giving off. In addition, inert gas Ar may be added to the mixed gas of $SF_6$ and $O_2$ so as to prevent the reacted product and radical from adhering to the front surface of the benzocyclobutene layer.

In the semiconductor device and fabrication method thereof according to the present invention, examples of the material of the metal film as the conductive portion include Al, Ti, Pt, Mo, W, and alloys thereof.

In the semiconductor device and fabrication method thereof according to the present invention, the metal thin film functions as a plating base metal. Examples of the metal film include noble metals such as Au and Pt. However, since these noble metals do not well adhere to the lower wiring pattern layer, a metal film composed, for example, of Ti is formed as the bottommost layer so as to improve the adhesion characteristic of the plating base metal to the lower wiring pattern layer.

In the semiconductor device and fabrication method thereof according to the present invention, the refractory metal film is a metal that allows the gold plate to well adhere to the protection film. Examples of such metal include Ti, Mo, and W.

In the semiconductor device and fabrication method thereof according to the present invention, the protection film is a CVD passivation film such as a silicon nitride film. The CVD passivation film is formed by plasma CVD process.

The semiconductor device and fabrication method thereof according to the present invention can be applied to any wiring structure having gold plating. For example, the semiconductor device and fabrication method thereof according to the present invention can be applied to a radio frequency integrated circuit using a GaAs semiconductor substrate.

According to the present invention, a semiconductor device using gold plating with good smoothness and good coverage of a protection film is provided. In addition, since the opening that is an electrically connecting portion is composed of a combination of protection films of refractory metal Ti and SiN, moisture and so forth do not permeate thereinto. Moreover, since the FET portion is passivated with an inter-layer insulation film composed of benzocyclobutene and a protection film composed of SiN, even with a resin package, the device can have good moisture resistance.

These and other objects, features and advantages of the present invention will become more apparent in light of the following detailed description of a best mode embodiment thereof, as illustrated in the accompanying drawings.

DESCRIPTION OF PREFERRED EMBODIMENTS

Next, with reference to FIGS. 1A to 1N, an embodiment of the present invention will be described.

Figure 1A:
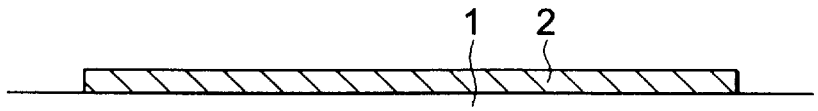
FIG. 1A is a sectional view showing fabrication steps of a semiconductor device according to the present invention.
Figure 1B:
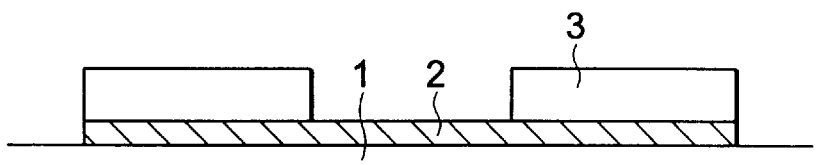
FIG. 1B is a sectional view showing fabrication steps of a semiconductor device according to the present invention.
Figure 1C:
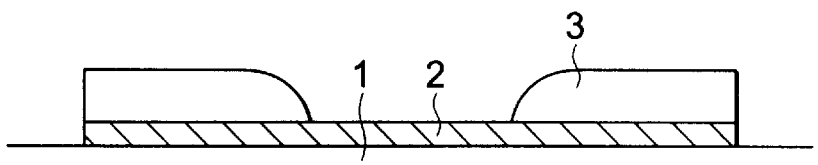
FIG. 1C is a sect ional view showing fabrication steps of a semiconductor device according to the present invention.
Figure 1D:
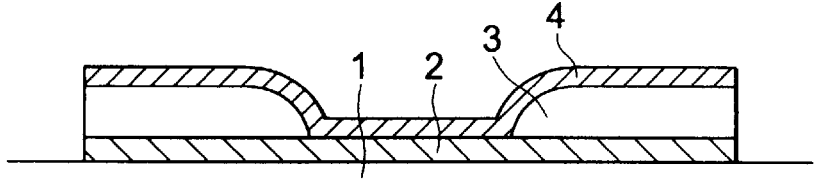
FIG. 1D is a sectional view showing fabrication steps of a semiconductor device according to the present invention.

A metal film 2 is formed on a GaAs semiconductor substrate 1 (see FIG. 1A). The metal film 2 is composed of an Au layer, a Pt layer, and a Ti layer that are successively disposed as an upper layer, a middle layer, and a lower layer, respectively. The thicknesses of the Au layer, the Pt layer, and the Ti layer are 10,000 Å, 300 Å, and 500 Å, respectively. An under-resist 3 is formed for a thickness of 1.5 μm on the metal film 2 by photo-etching process (see FIG. 1B). The under-resist 3 is hard-baked (see FIG. 1C). A plating base metal film 4 is formed on the under-resist 3 that has been hard-baked. The plating base metal film 4 is composed of an Au layer and a Ti layer that are successively disposed as an upper layer and a lower layer, respectively (see FIG. 1D). The thicknesses of the Au layer and the Ti layer are 1,000 Å and 50 Å, respectively.

Figure 1E:
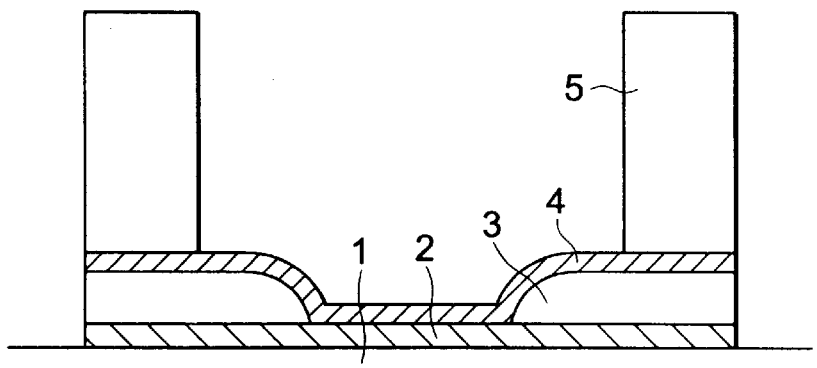
FIG. 1E is a sectional view showing fabrication steps of a semiconductor device according to the present invention.

For a plating process, a top-resist 5 is formed for a thickness of around 6 μm on the plating base metal film 4 (see FIG. 1E).

Figure 1F:
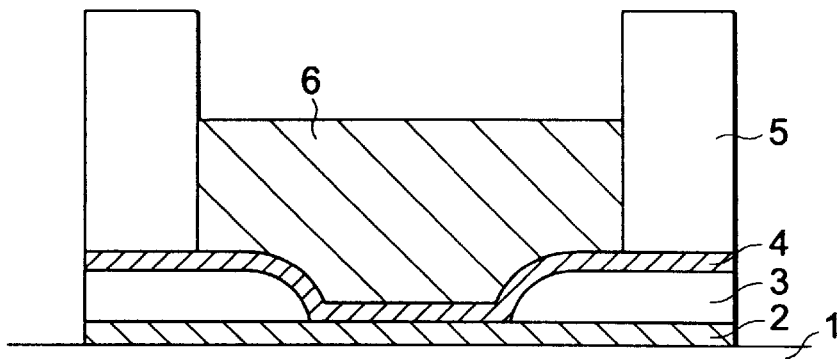
FIG. 1F is a sectional view showing fabrication steps of a semiconductor device according to the present invention.
Figure 1G:
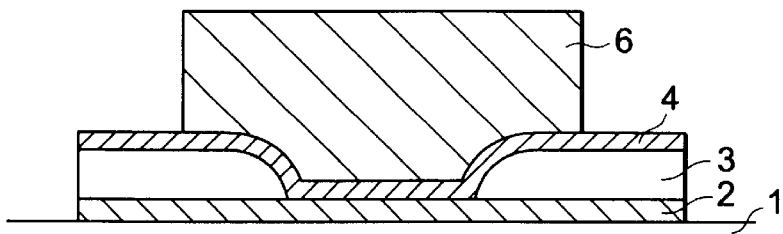
FIG. 1G is a sectional view showing fabrication steps of a semiconductor device according to the present invention.

Gold 6 is plated for a thickness of 4 μm (see FIG. 1F). The top-resist 5 is peeled off (see FIG. 1G).

Figure 1H:
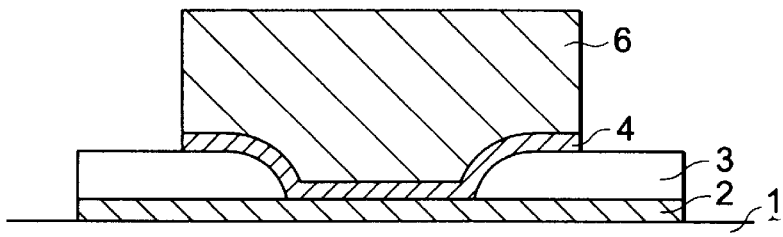
FIG. 1H is a sectional view showing fabrication steps of a semiconductor device according to the present invention.
Figure 1I:
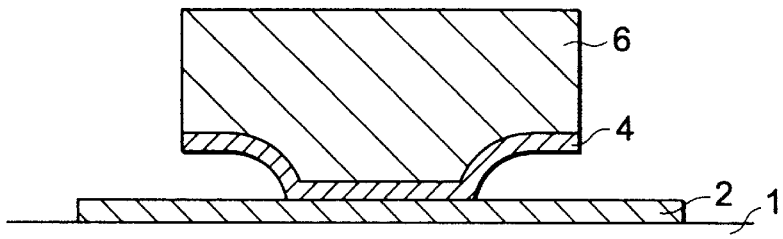
FIG. 1I is a sectional view showing fabrication steps of a semiconductor device according to the present invention.

The plating base metal film 4 is etched (see FIG. 1H) The under-resist 3 is removed (see FIG. 1I).

Figure 1J:
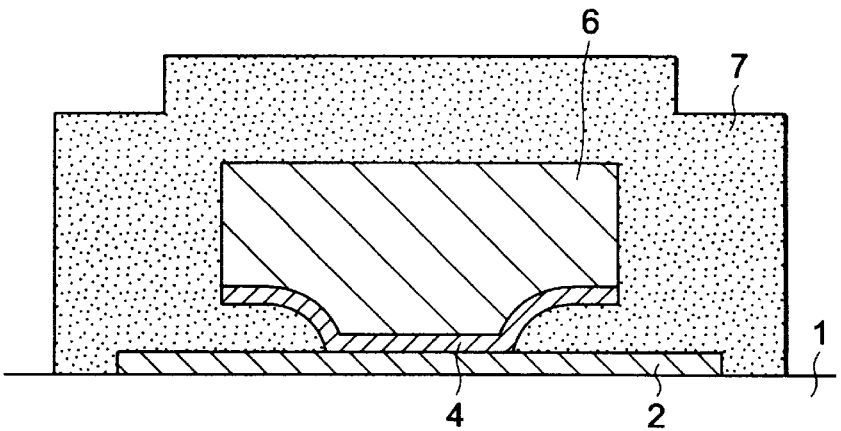
FIG. 1J is a sectional view showing fabrication steps of a semiconductor device according to the present invention.

As an inter-layer insulation film, a benzocyclobutene (manufactured by Dow-Chemical Co. under the trade name of CYCLOTENE) film 7 is coated for a thickness of 8 μm on the entire front surface of the substrate. The substrate is placed in an oven heated at 75° C. for 20 minutes. The benzocyclobutene film 7 is exposed with 300 to 500 mJ/cm$^2$ and hardened (see FIG. 1J)

Figure 1K:
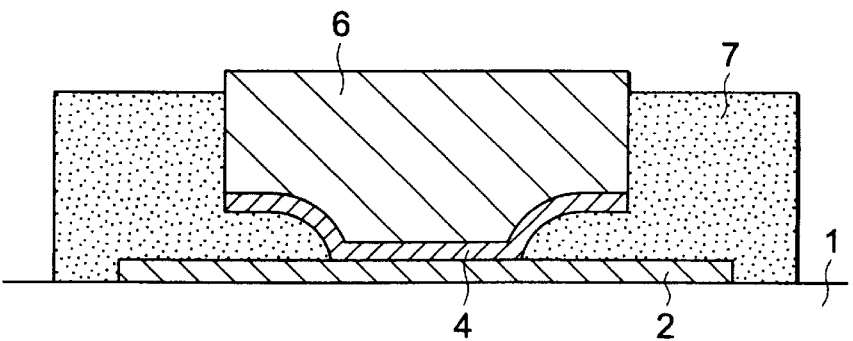
FIG. 1K is a sectional view showing fabrication steps of a semiconductor device according to the present invention.

Etch-back resist (not shown) for the benzocyclobutene film 7 is coated for a thickness of 1.5 μm. With $CF_4/O_2$ gas, the benzocyclobutene film 7 is etched back by reactive ion etching process. At this point, since the gold plate 6 is not etched, the top thereof is exposed. The exposed height of the gold plate 6 is designated in the range from around 0.5 to 1.0 μm for a subsequent photo-etching process (see FIG. 1K).

Figure 1L:
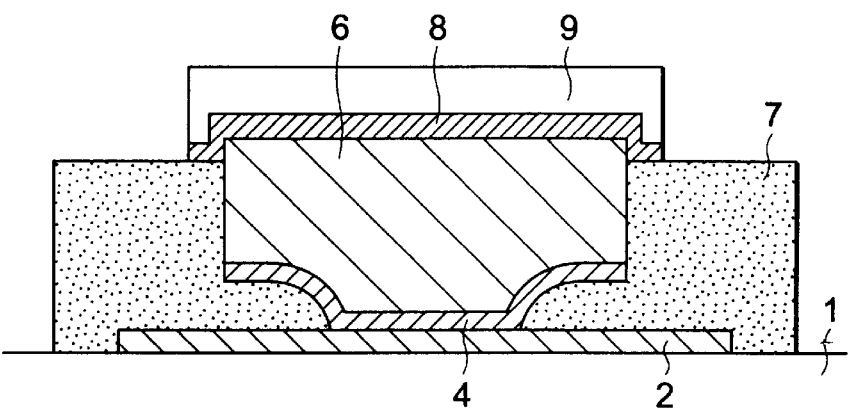
FIG. 1L is a sectional view showing fabrication steps of a semiconductor device according to the present invention.

To cause the gold plate 6 to well adhere to a SiN film 10 as a top passivation film, a Ti film 8 is evaporated for a thickness of around 50 Å on the entire front surface of the substrate. After the Ti film 8 is evaporated, a photo-etching process is performed for the front surface of the substrate in such a manner that the gold plate 6 is masked with resist 9. The thickness of the resist 9 is designated in the range from 50 Å to 100 Å. The Ti film 8 that has not been masked is etched out with $NH_4F$ (see FIG. 1L).

Figure 1M:
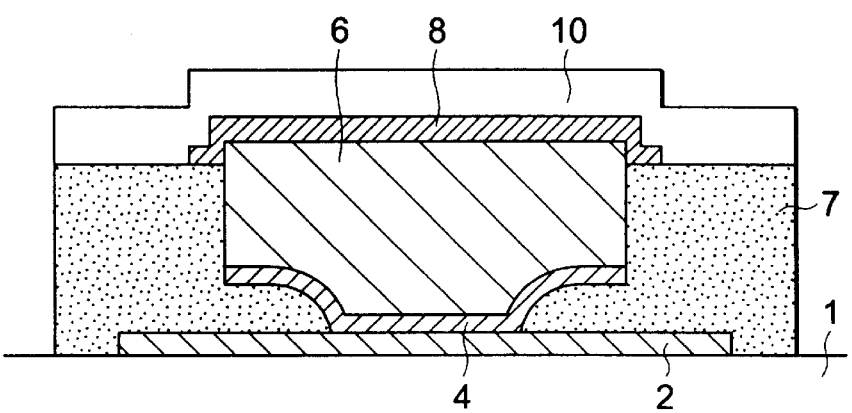
FIG. 1M is a sectional view showing fabrication steps of a semiconductor device according to the present invention.
Figure 1N:
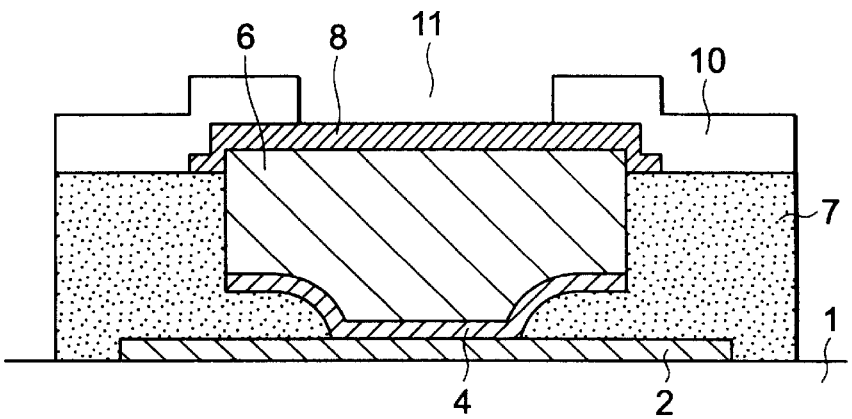
FIG. 1N is a sectional view showing fabrication steps of a semiconductor device according to the present invention.
Figure 2A:
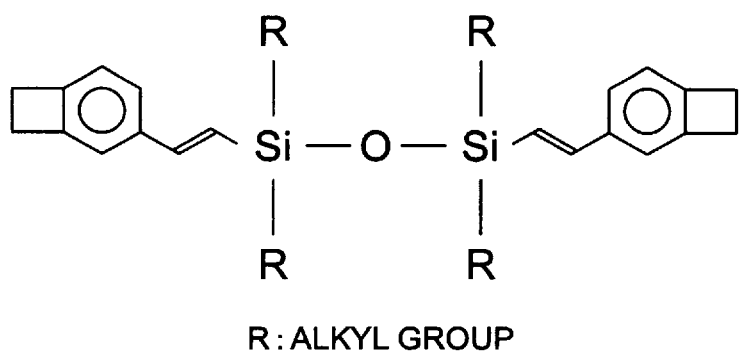
FIG. 2A is a schematic diagram showing the structure of benzocyclobutene used as an inter-layer insulation film of a semiconductor device according to the present invention.
Figure 2B:
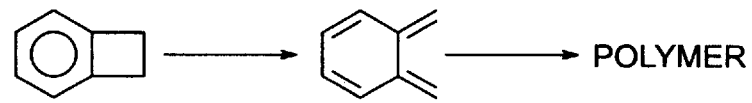
FIG. 2B is a schematic diagram showing a polycondensation structure of benzocyclobutene.
Figure 3A:
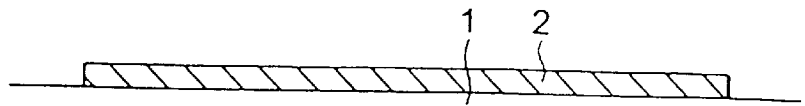
FIG. 3A is a sectional view showing a fabrication step of a conventional semiconductor device using gold plating.
Figure 3B:
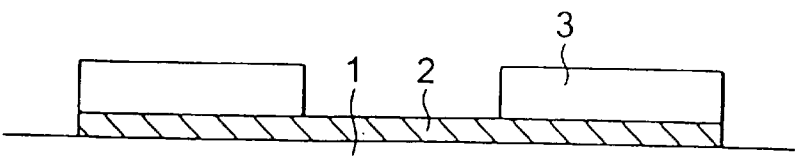
FIG. 3B is a sectional view showing a fabrication step of a conventional semiconductor device using gold plating.
Figure 3C:
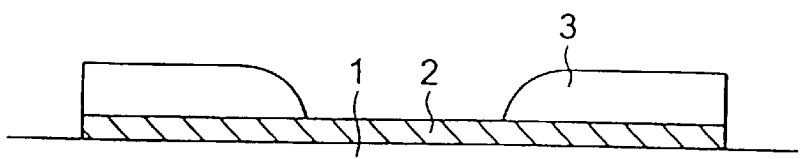
FIG. 3C is a sectional view showing a fabrication step of a conventional semiconductor device using gold plating.
Figure 3D:
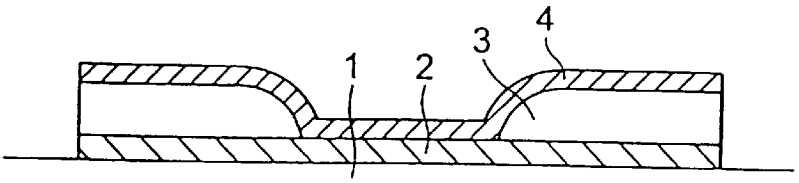
FIG. 3D is a sectional view showing a fabrication step of a conventional semiconductor device using gold plating.
Figure 3E:
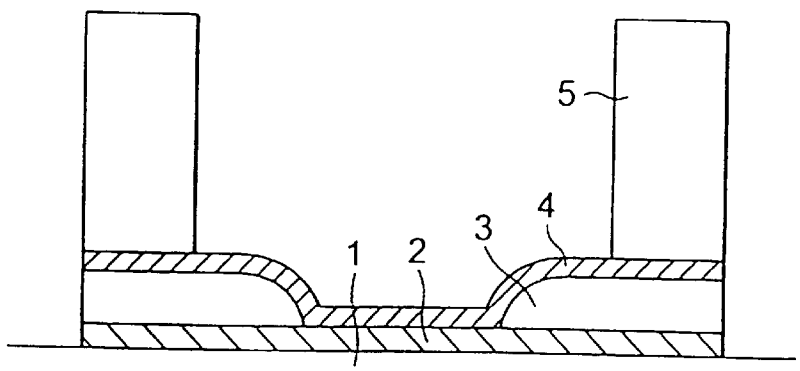
FIG. 3E is a sectional view showing a fabrication step of a conventional semiconductor device using gold plating.
Figure 3F:
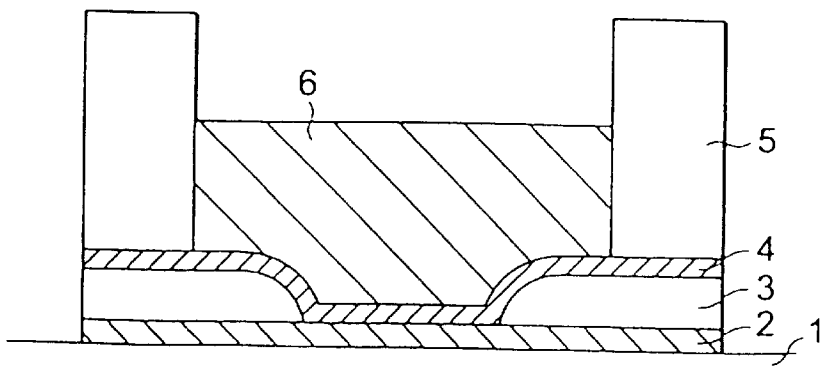
FIG. 3F is a sectional view showing a fabrication step of a conventional semiconductor device using gold plating.
Figure 3G:
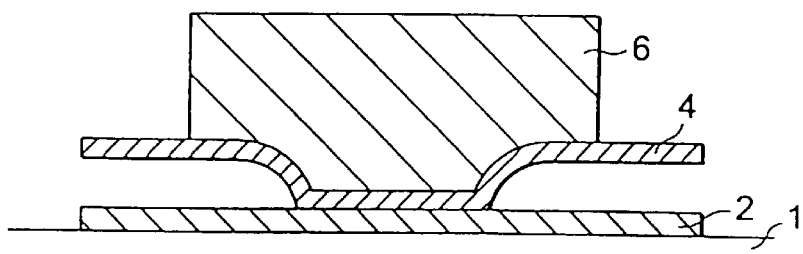
FIG. 3G is a sectional view showing a fabrication step of a conventional semiconductor device using gold plating.
Figure 3H:
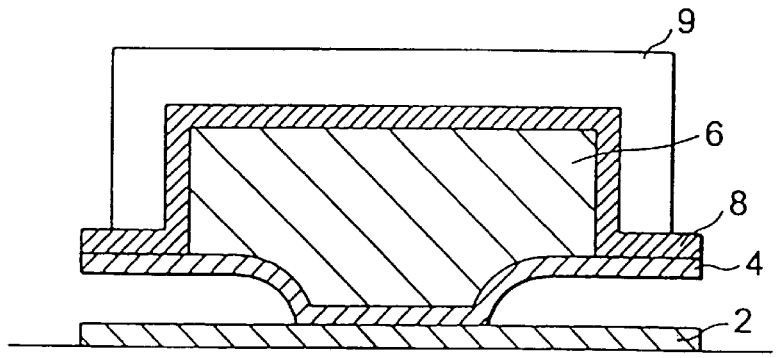
FIG. 3H is a sectional view showing a fabrication step of a conventional semiconductor device using gold plating.

After the resist 9 is peeled off by the photo-etching process, a SiN film 10 as a top passivation film is deposited for a thickness of around 4000 Å by plasma CVD process (see FIG. 1M).

By repeating the above-described steps for a required number of layers, a multi-layer wiring structure is obtained. An opening 11 for a bonding pad is formed on the gold plate 6. Thus, a semiconductor device is obtained.

Since the opening 11 is composed of the Ti film 8 and the SiN film 10, it has high adhesion characteristic. Thus, moisture and so forth do not permeate thereinto. In addition, an FET portion is passivated with the benzocyclobutene film 7 and the SiN film 10. Thus, even with a resin package, the device can have good moisture resistance.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A semiconductor device, comprising:

a semiconductor substrate;

a conductive portion formed on the semiconductor substrate;

a metal film formed on the conductive portion, the metal film having a bottom surface including both a contacting area with the conductive portion and a non-contacting area with the conductive portion;

a gold plate portion formed on an entire upper surface of the metal film;

an inter-layer insulation film formed on an area of the semiconductor substrate, the area being free from the conductive portion, the metal film, and the gold plate portion in such a manner that the inter-layer insulation film contacts side walls of the conductive portion, the metal film and the gold plate portion;

a refractory metal film formed in such a manner that the refractory metal film coats a whole top wall of the gold plate portion; and a protection film formed in such a manner that the protection film exposes a part of the refractory metal film on the gold plate portion as a bonding wire connecting portion and coats the inter-layer insulation film and another part of the refractory metal film.

2. The semiconductor device as set forth in claim 1, wherein the inter-layer insulation film is an organic film.

3. The semiconductor device as set forth in claim 1, wherein the protection film is a silicon nitride film.

4. The semiconductor device as set forth in claim 1, wherein the semiconductor substrate is a gallium-arsenic substrate.

\* \* \* \* \*